(12) United States Patent
Lee (10) Patent No.: US 11,431,290 B1
(45) Date of Patent: Aug. 30, 2022

(54) CAPACITOR CIRCUIT AND OSCILLATOR

(71) Applicant: SAMSUNG ELECTRO-MECHANICS CO., LTD., Suwon-si (KR)

(72) Inventor: Soo Woong Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 17/491,839

(22) Filed: Oct. 1, 2021

(30) Foreign Application Priority Data

May 31, 2021 (KR) .................. 10-2021-0070257

(51) Int. Cl.
*H03B 5/12* (2006.01)
*H03K 3/42* (2006.01)

(52) U.S. Cl.
CPC ......... *H03B 5/1228* (2013.01); *H03B 5/1265* (2013.01); *H03K 3/42* (2013.01)

(58) Field of Classification Search
CPC ....... H03B 5/1228; H03B 5/1265; H03K 3/42
USPC .......... 331/177 V, 179, 36 C, 16, 167, 117 R
See application file for complete search history.

(56) References Cited

U.S. PATENT DOCUMENTS

| 4,728,932 A * | 3/1988 | Atherton ............ G01R 27/2605 341/26 |
| 2016/0126934 A1* | 5/2016 | De Jongh ............... H03J 5/246 334/55 |

FOREIGN PATENT DOCUMENTS

| EP | 3343774 A1 * | 7/2018 | .......... H03K 3/0231 |
| KR | 10-2006-0041334 A | 5/2006 | |
| KR | 10-2007-0081532 A | 8/2007 | |

* cited by examiner

*Primary Examiner* — Arnold M Kinkead
(74) *Attorney, Agent, or Firm* — NSIP Law (57) ABSTRACT

A capacitor circuit includes a capacitor array including first to n-th capacitors connected to each other in parallel; a select switch circuit including first to n-th select switches connected to the first to n-th capacitors in series, respectively; and a short switch circuit including first to n-th short switches connected to the first to n-th capacitors in parallel, respectively, and operating complementarily to the first to n-th select switches, respectively, wherein n is an integer of 2 or greater.

20 Claims, 9 Drawing Sheets

CAPACITOR CIRCUIT AND OSCILLATOR

CROSS-REFERENCE TO RELATED APPLICATIONS

This application claims the benefit under 35 U.S.C. § 119(a) of Korean Patent Application No. 10-2021-0070257 filed on May 31, 2021 in the Korean Intellectual Property Office, the entire disclosure of which is incorporated herein by reference for all purposes.

BACKGROUND

1. Field

The following description relates to a capacitor circuit and an oscillator.

2. Description of Related Art

Recently developed touch sensing devices may replace mechanical switches of existing smartphones with electronic switches configured to generate touch and force signals.

Such a touch sensing device may include an oscillator to sense a touch and force. In the touch sensing device, a minute change is made in a frequency of the oscillator due to a touch or force, and the touch sensing device has to be able to detect the minute change in the frequency of the oscillator. Therefore, the oscillator should be designed with minimal noise, and a frequency shift due to an increase in a settling time or the like should be carefully managed.

In general, the oscillator requires a settling time of a frequency of an oscillation signal until the frequency is settled. If a device detecting a minute change in frequency, such as a touch sensing device, does not support a fast settling time, the device cannot accurately detect a change in frequency at an initial stage of operation.

For example, if the settling time increases, the touch sensing device may perform an inaccurate sensing operation, thereby lowering sensing sensitivity.

An existing single-ended oscillator may include a single-ended capacitor array, and an existing differential oscillator may include a differential capacitor array. The existing single-ended oscillator and differential oscillator may include a plurality of capacitors connected to each other in parallel, and a switch element for performing an ON/OFF operation may be connected to each capacitor in series.

When each switch element is turned on, a corresponding capacitor may be connected to an inductor circuit, and, when each switch element is turned off, a corresponding capacitor may be disconnected from the inductor circuit. For example, when the switch element is in an ON state, the switch element may have a small resistance value of several ohms or less. When the switch element is in an OFF state, the switch element may have a very large resistance value of several megaohms or more. When the resistance value of several megaohms is connected to a capacitor in series, the time constant is large and the capacitor may take a longer time to discharge, resulting in a significant amount of time being consumed for frequency settling. That is, if the oscillation frequency is not settled for a relatively long time at the beginning of the operation, sensitivity of a touch sensing operation is lowered at the beginning of the operation.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a capacitor circuit includes: a capacitor array including first to n-th capacitors connected to each other in parallel; a select switch circuit including first to n-th select switches connected to the first to n-th capacitors in series, respectively; and a short switch circuit including first to n-th short switches connected to the first to n-th capacitors in parallel, respectively, and configured to operate complementarily to the first to n-th select switches, respectively, wherein n is an integer of 2 or greater.

A k-th select switch, among the first to n-th select switches, may be connected to a k-th capacitor, among the first to n-th capacitors, in series, wherein $1 \leq k \leq n$.

A k-th short switch, among the first to n-th short switches, may be connected to the k-th capacitor in parallel.

In response to a short control signal, the k-th short switch may be turned off when the k-th select switch is turned on, and turned on when the k-th select switch is turned off.

The k-th short switch may connect two ends of the k-th capacitor to make potentials at the two ends of the k-th capacitor equal, when the k-th short switch is in an ON state.

Each of the first to n-th select switches may include an NMOS transistor.

Each of the first to n-th select switches may include a PMOS transistor.

Each of the first to n-th short switches may include a transmission gate.

In another general aspect, an oscillator includes a capacitor circuit including: first to n-th capacitors connected to each other in parallel; a select switch circuit including first to n-th select switches connected to the first to n-th capacitors in series, respectively; and a short switch circuit including first to n-th short switches connected to the first to n-th capacitors in parallel, respectively, and configured to operate complementarily to the first to n-th select switches, respectively, wherein n is an integer of 2 or greater. The oscillator further includes: an inductor circuit connected to the capacitor circuit for resonance; and a switching controller configured to control selection of at least one of the first to n-th capacitors.

A k-th select switch, among the first to n-th select switches, may be connected to a k-th capacitor, among the first to n-th capacitors, in series, wherein $1 \leq k \leq n$.

A k-th short switch, among the first to n-th short switches, may be connected to the k-th capacitor in parallel.

In response to a short control signal, the k-th short switch may be turned off when the k-th select switch is turned on, and turned on when the k-th select switch is turned off.

The k-th short switch may connect two ends of the k-th capacitor to make potentials at the two ends of the k-th capacitor equal, when the k-th short switch is in an ON state.

Each of the first to n-th select switches may include an NMOS transistor.

Each of the first to n-th select switches may include a PMOS transistor.

Each of the first to n-th short switches may include a transmission gate.

In another general aspect, a capacitor circuit includes: a plurality of capacitors connected to each other in parallel; a plurality of select switches connected to the plurality of capacitors in series, respectively; and a plurality of short switches connected to the plurality of capacitors in parallel, respectively, wherein a short switch, among the plurality of short switches, connected to a capacitor, among the plurality of capacitors, in parallel connects two ends of the capacitor to make potentials at the two ends of the capacitor equal, when the short switch is in an ON state.

The short switch may be configured to be turned off when a select switch, among the plurality of select switches, connected to the capacitor in series is turned on. The short switch may be configured to be turned on when the select switch is turned off.

The plurality of short switches may include a plurality of transmission gates.

The plurality of select switches may include a plurality of NMOS transistors, and the plurality of short switches may include a plurality of PMOS transistors.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is to be noted that use of the term "may" with respect to an embodiment or example, e.g., as to what an embodiment or example may include or implement, means that at least one embodiment or example exists in which such a feature is included or implemented while all examples and examples are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 1:
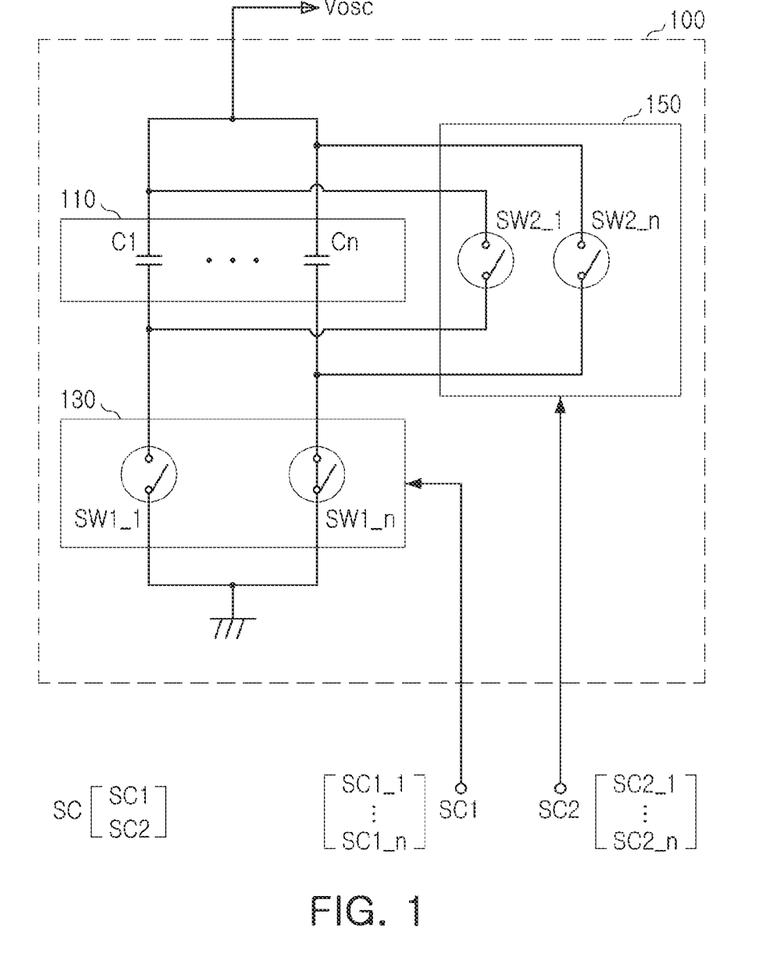
FIG. 1 is an exemplary diagram of a capacitor circuit, according to an embodiment.
Figure 2:
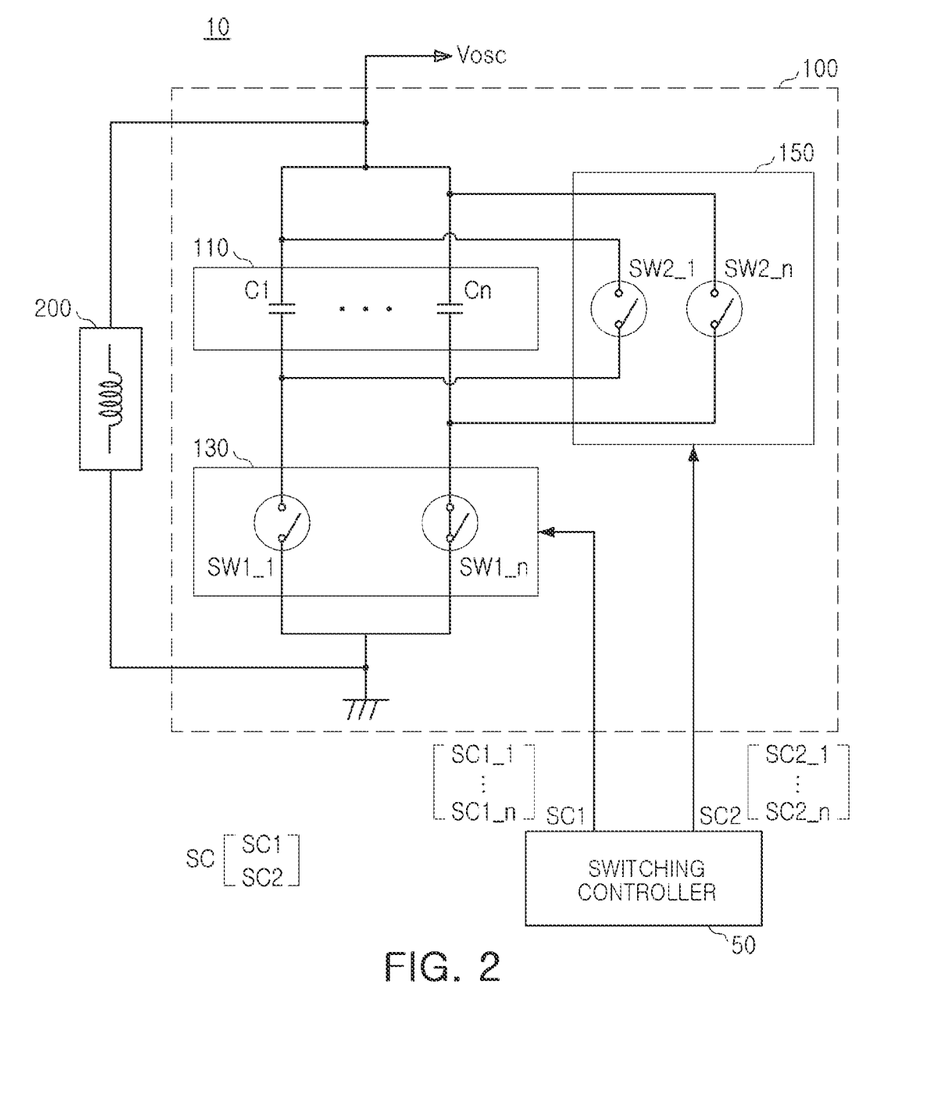
FIG. 2 is a diagram of an oscillator, according to an embodiment.

FIG. 1 is a view of a capacitor circuit 100, according to an embodiment. FIG. 2 is a view of an oscillator 10, according to an embodiment in.

Referring to FIG. 2, the oscillator 10 may include the capacitor circuit 100, an inductor circuit 200, and a switching controller 50.

Referring to FIGS. 1 and 2, the capacitor circuit 100 may include a capacitor array 110, a select switch circuit 130, and a short switch circuit 150.

The capacitor array 110 may include first to n-th capacitors C1 to Cn connected to each other in parallel, wherein n is an integer of 2 or greater. As an example, the first to n-th capacitors C1 to Cn may have the same capacitance. As another example, at least one of the first to n-th capacitors C1 to Cn may have a different capacitance than other capacitors among the first to n-th capacitors C1 to Cn.

For example, the select switch circuit 130 may include first to n-th select switches SW1_1 to SW1_$n$ connected in series the first to n-th capacitors C1 to Cn, respectively.

For example, the short switch circuit 150 may include first to n-th short switches SW2_1 to SW2_$n$ respectively connected to the first to n-th capacitors C1 to Cn in parallel. The first to n-th short switches SW2_1 to SW2_$n$ may operate complementarily to the first to n-th select switches SW1_1 to SW1_$n$, respectively.

Referring to FIG. 2, an inductor circuit 200 may be connected to the capacitor circuit 100 for resonance. For example, the inductor circuit 200 may include at least one inductor element.

The switching controller 50 may control selection of at least one of the first to n-th capacitors C1 to Cn.

For example, the switching controller 50 may generate a first control signal SC1 and output the generated first control signal SC1 to the select switch circuit 130, and generate a second control signal SC2 and output the generated second control signal SC2 to the short switch circuit 150.

In the following description, unnecessary, redundant descriptions for the same reference numerals and components having the same function may be omitted for each drawing, and differences may be described for each drawing.

Figure 3:
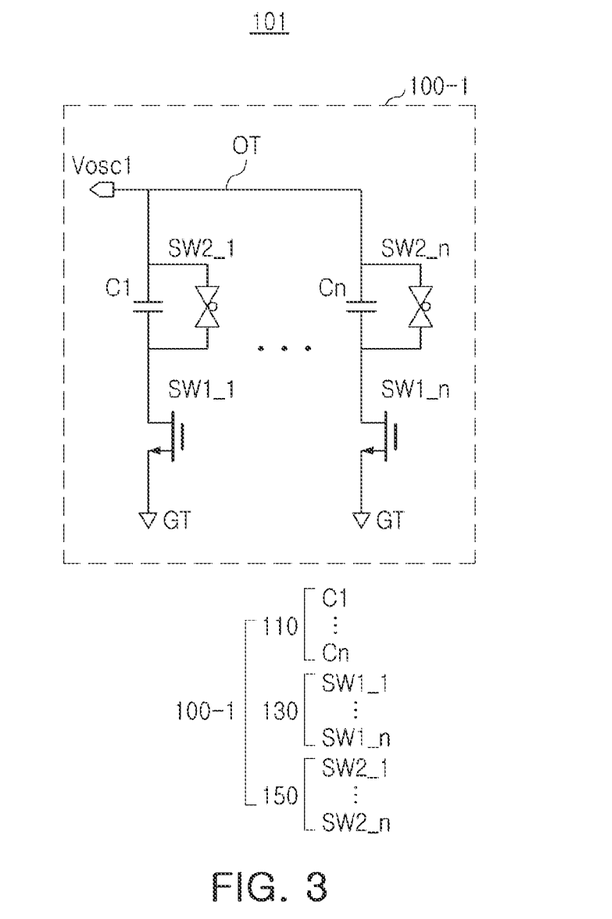
FIG. 3 is a diagram of a capacitor circuit, according to an embodiment.
Figure 4:
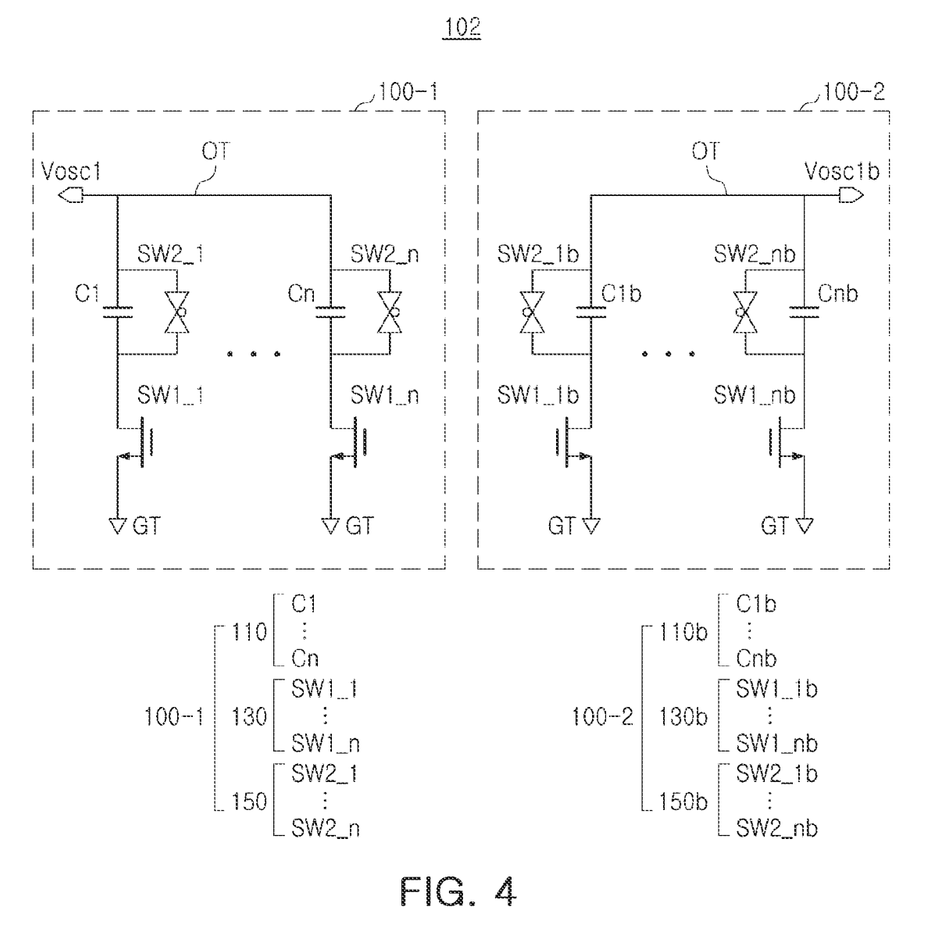
FIG. 4 is a diagram of a capacitor circuit, according to an embodiment.

FIG. 3 is a view of a capacitor circuit 101, according to an embodiment. FIG. 4 is a view of a capacitor circuit 102, according to an embodiment.

Referring to FIG. 3, the capacitor circuit 101 may include a first capacitor circuit 100-1 for single oscillation.

The first capacitor circuit 100-1 may include the capacitor array 110, referred to hereinafter as a first capacitor array, the select switch circuit 130, referred to hereinafter as a first select switch circuit, and the short switch circuit 150, referred to hereinafter as a first short switch circuit.

The first capacitor array 110 may include the first to n-th capacitors C1 to Cn connected to each other in parallel.

The first select switch circuit 130 may include the first to n-th select switches SW1_1 to SW1_$n$ connected in series to the first to n-th capacitors C1 to Cn, respectively. For example, the first to n-th select switches SW1_1 to SW1_$n$ may be formed of NMOS transistors, but are not limited thereto.

For example, between an output terminal OT of the first oscillation signal Vosc1 and a ground GT, the first capacitor C1 and the first select switch SW1_1 may be connected in series and the n-th capacitor Cn and the n-th select switch SW1_$n$ may be connected in series.

The first short switch circuit 150 may include first to n-th short switches SW2_1 to SW2_$n$ connected to the first to n-th capacitors C1 to Cn in parallel, and operating complementarily to the first to nth select switches SW1_1 to SW1_$n$. For example, the first to n-th short switches SW2_1 to SW2_$n$ may be formed of a transmission gate, but are not limited thereto.

Referring to FIG. 4, the capacitor circuit 102 may include the first capacitor circuit 100-1 and a second capacitor circuit 100-2 for differential oscillation.

The first capacitor circuit 100-1 is the same as the circuit shown in FIG. 3, and thus, a redundant description thereof is not provided.

The second capacitor circuit 100-2 may include a second capacitor array 110$b$, a second select switch circuit 130$b$, and a second short switch circuit 150$b$.

The second capacitor array 110$b$ may include first to n-th capacitors C1$b$ to Cn$b$ connected to each other in parallel.

The second select switch circuit 130$b$ may include first to n-th select switches SW1_1$b$ to SW1_$nb$ connected in series to the first to n-th capacitors C1$b$ to Cn$b$, respectively. For example, the first to n-th select switches SW1_1$b$ to SW1_$nb$ may be formed of NMOS transistors, but are not limited thereto.

For example, between an output terminal OT of a second oscillation signal Vosc1$b$ and a ground GT, the first capacitor C1$b$ and the first select switch SW1_1$b$ may be connected in series and the n-th capacitor Cn$b$ and the n-th select switch SW1_$nb$ may be connected in series.

The second short switch circuit 150$b$ may include first to n-th short switches SW2_1$b$ to SW2_$nb$ connected to the first to n-th capacitors C1$b$ to Cn$b$, respectively, in parallel, and operating complementarily to the first to n-th select switches SW1_1$b$ to SW1_$nb$. For example, the first to n-th short switches SW2_1$b$ to SW2_$nb$ may be formed of a transmission gate, but are not limited thereto.

Figure 5:
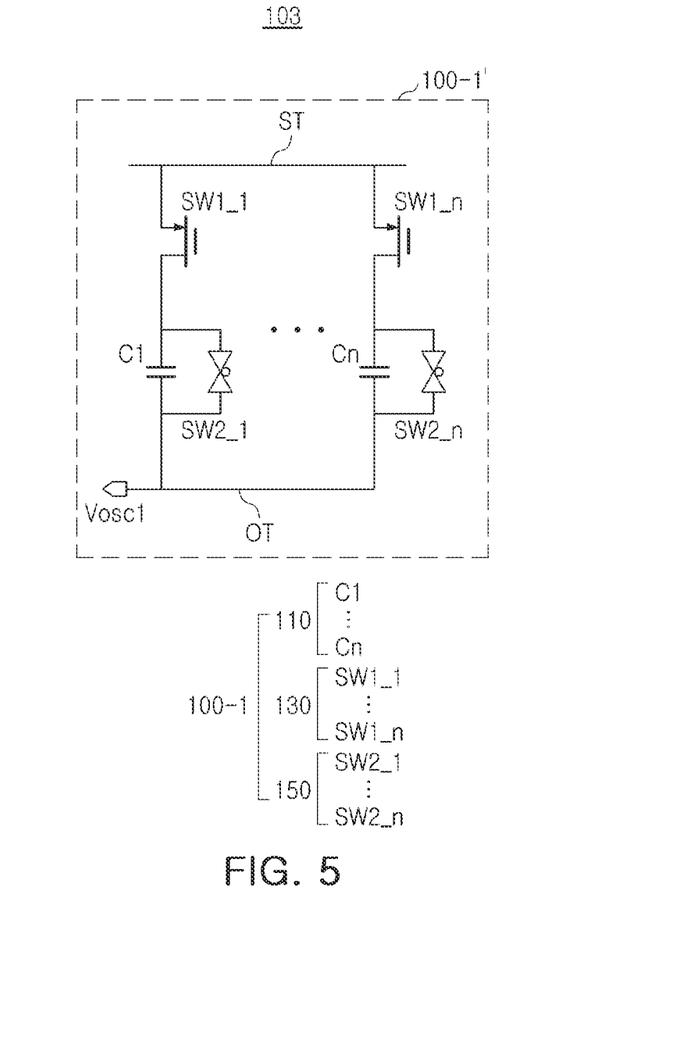
FIG. 5 is a diagram of a capacitor circuit, according to an embodiment.
Figure 6:
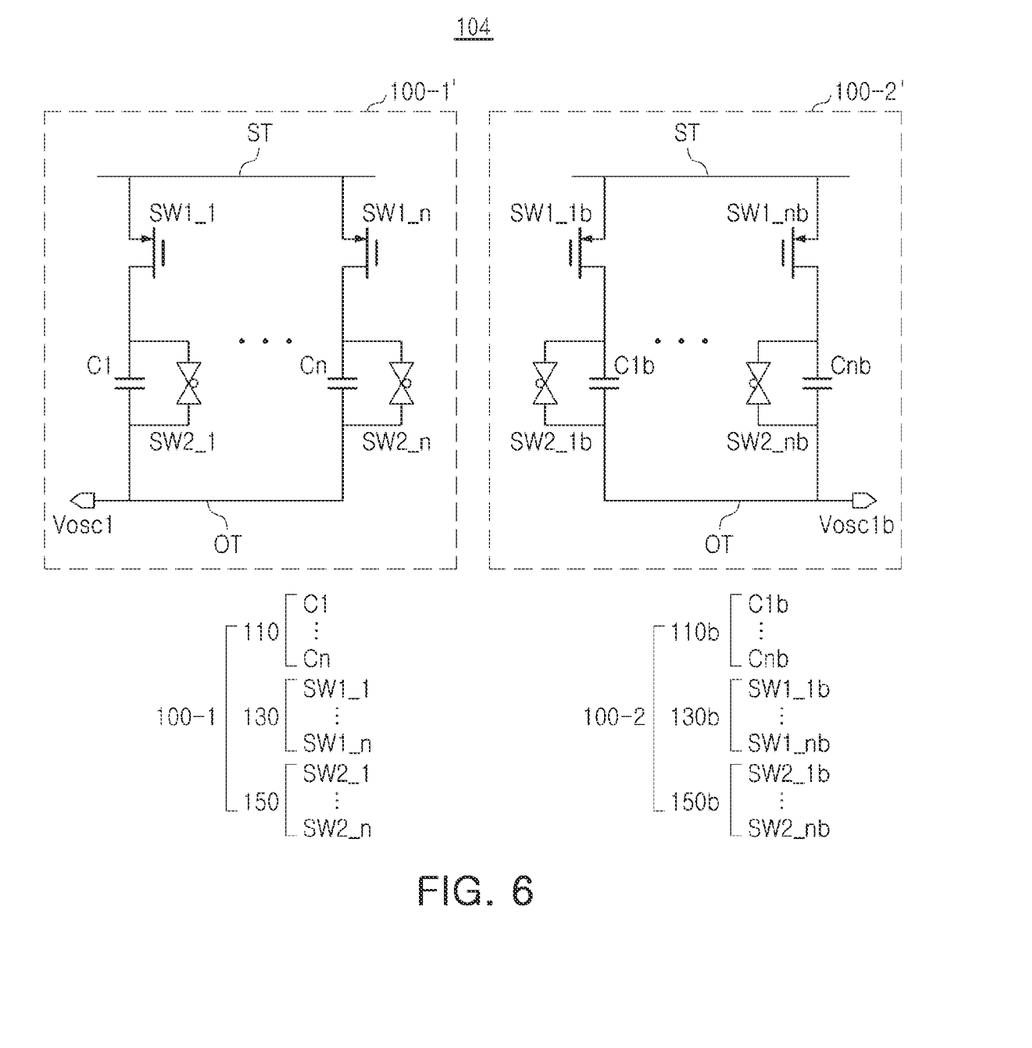
FIG. 6 is a diagram of a capacitor circuit, according to an embodiment.

FIG. 5 is a view of a capacitor circuit 103, according to an embodiment. FIG. 6 is an view of a capacitor circuit 104, according to an embodiment.

Referring to FIG. 5, the capacitor circuit 103 may include a first capacitor circuit 100-1' for single oscillation.

The first capacitor circuit 100-1' may include the first capacitor array 110, the first select switch circuit 130, and the first short switch circuit 150.

The first capacitor array 110 may include the first to n-th capacitors C1 to Cn connected to each other in parallel.

The first select switch circuit 130 may include the first to n-th select switches SW1_1 to SW1_$n$ connected in series to the first to n-th capacitors C1 to Cn, respectively. For example, the first to n-th select switches SW1_1 to SW1_$n$ may be formed of PMOS transistors, but are not limited thereto.

For example, between a power supply terminal ST and an output terminal OT of a first oscillation signal Vosc1, the first select switch SW1_1 and the first capacitor C1 may be connected in series and the n-th select switch SW1_$n$ and the n-th capacitor Cn may be connected in series.

The first short switch circuit 150 may include the first to n-th short switches SW2_1 to SW2_$n$ connected to the first to n-th capacitors C1 to Cn in parallel, and operating complementarily to the first to n-th select switches SW1_1 to SW1_$n$. For example, the first to n-th short switches SW2_1 to SW2_$n$ may be formed of a transmission gate, but are not limited thereto.

Referring to FIG. 6, the capacitor circuit 104 may include the first capacitor circuit 100-1' and a second capacitor circuit 100-2' for differential oscillation.

Since the first capacitor circuit 100-1' is the same as the circuit shown in FIG. 5, a redundant description thereof is omitted.

The second capacitor circuit 100-2' may include the second capacitor array 110$b$, the second select switch circuit 130$b$, and the second short switch circuit 150$b$.

The second capacitor array 110$b$ may include the first to n-th capacitors C1$b$ to Cn$b$ connected to each other in parallel.

The second select switch circuit 130$b$ may include the first to n-th select switches SW1_1$b$ to SW1_$nb$ connected to the first to n-th capacitors C1$b$ to Cn$b$, respectively, in series. For example, the first to n-th select switches SW1_1b to SW1_nb may be formed of PMOS transistors, but are not limited thereto.

For example, between the power supply terminal ST and the output terminal OT of the second oscillation signal Vosc1b, the first select switch SW1_1b and the first capacitor C1b may be connected in series, the n-th selection switch SW1_nb and the n-th capacitor Cnb may be connected in series.

The second short switch circuit 150b may include the first to n-th short switches SW2_1b to SW2_nb connected in parallel to the first to n-th capacitors C1b to Cnb, and operating complementarily to the first to n-th select switches SW1_1b to SW1_nb. For example, the first to n-th short switches SW2_1b to SW2_nb may be formed of a transmission gate, but are not limited thereto.

Figure 7:
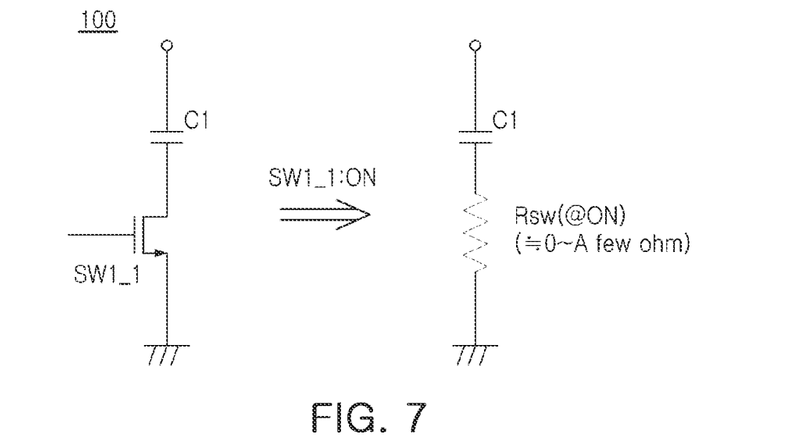
FIG. 7 is an equivalent diagram of a capacitor circuit in which a first select switch is in an ON state, according to an embodiment.
Figure 8:
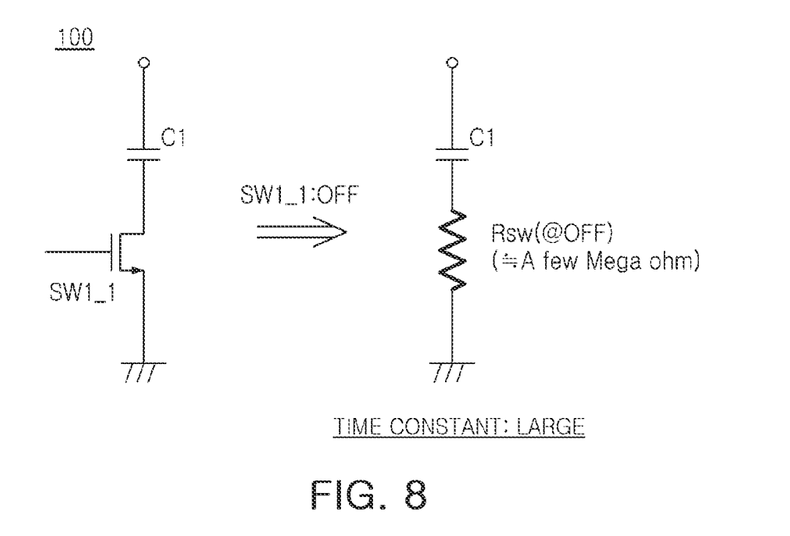
FIG. 8 is an equivalent diagram of a capacitor circuit in which a first select switch is in an OFF state, according to an embodiment.

FIG. 7 is an example of an equivalent capacitor circuit in which the first select switch SW1_1 is in an ON state. FIG. 8 is an example of an equivalent capacitor circuit in which the first select switch SW1_1 is in an OFF state. The following description of FIGS. 7 and 8 refers to the capacitor circuit 100, but it is to be understood that the description of FIGS. 7 and 8 also applies to the first capacitor circuits 101 to 104 described above.

Referring to FIGS. 7 and 8, in a case in which the first capacitor circuit 100 includes the first capacitor C1 and the first select switch SW1_1, an equivalent circuit in which the first select switch SW1_1 is in an ON state is illustrated in FIG. 7, and an equivalent circuit in which the first select switch SW1_1 is in an OFF state is illustrated in FIG. 8.

Referring to FIG. 7, when the first select switch SW1_1 is in the ON state, the first select switch SW1_1 may have a small resistance value of several ohms or less. The first capacitor C1 may be connected to the inductor circuit 200 (FIG. 2) for resonance by the first select switch SW1_1 being in the ON state.

Referring to FIG. 8, when the first select switch SW1_1 is in the OFF state, the first select switch SW1_1 has a very large resistance value of several megaohms or more. In this case, when the resistance value of several megaohms is connected in series to the first capacitor C1, the time constant is large and the first capacitor may take a greater time to discharge, resulting in a significant amount of delay time being consumed for frequency settling if no short switch is included.

Figure 9:
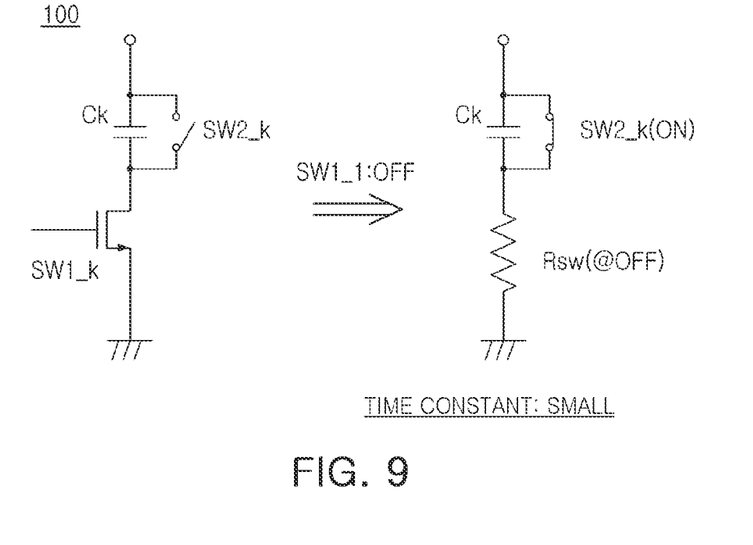
FIG. 9 is a view illustrating an equivalent capacitor circuit in which a first select switch is in an OFF state and a first short switch element is in an ON state, according to an embodiment.

In order to solve such a problem, the capacitor circuit 100 may further include the first short switch SW2_1, as shown in FIG. 9.

FIG. 9 is an example of an equivalent capacitor circuit in which the first select switch SW1_1 is in an OFF state and the first short switch element SW2_1 is in an ON state.

Referring to FIG. 9, the capacitor circuit 100 may include a k-th capacitor Ck (here, 1≤k≤n, n is an integer of 2 or greater), a k-th select switch SW1_k, and a k-th short switch SW2_k.

The k-th select switch SW1_k among the first to n-th select switches SW1_1 to SW1_n may be connected in series to a k-th capacitor Ck among the first to n-th capacitors C1 to Cn.

The k-th short switch SW2_k among the first to n-th short switches SW2_1 to SW2_n may be connected in parallel to a k-th capacitor Ck among the first to n-th capacitors C1 to Cn.

In response to a short control signal SW2, the k-th short switch SW2_k may be turned off when the k-th select switch SW1_k operating in response to the select control signal SW1 is turned on and may be turned on when the k-th select switch SW1_k is turned off.

For example, in an ON state, the k-th short switch SW2_k may connect both ends of the k-th capacitor Ck to make the potentials of both ends of the k-th capacitor Ck equal.

When the k-th select switch SW1_k is turned off, the k-th short switch SW2_k is turned on and a potential difference between both ends of the k-th capacitor C1 becomes 0, and thus, the discharge problem may be solved.

Hereinafter, a case in which the k-th capacitor Ck is the first capacitor C1, the k-th select switch SW1_k is the first select switch SW1_1, and the k-th short switch SW2_k is the first short switch SW2_1 will be described.

When the first select switch SW1_1 is turned on, the first short switch SW2_1 is turned off. Conversely, when the first select switch SW1_1 is turned off, the first short switch SW2_1 may be turned on. In other words, when the first select switch SW1_1 is turned on and the first short switch SW2_1 is turned off, capacitance of the first capacitor C1 is visible, and when the first select switch SW11 is turned off and the first short switch SW2_1 is turned on, capacitance of the first capacitor C1 is not visible.

Meanwhile, the existing capacitor circuit has a problem in that a discharging time increases due to large resistance of the first select switch SW1_1 in an OFF state of the first select switch SW1_1, which negatively affects initial settling. In contrast, in the capacitor circuit of the present disclosure, since the first short switch SW2_1 is turned on while the first select switch SW1_1 is off, a potential difference between both ends of the first capacitor C1 is 0, so a settling time may decrease, and thus, the discharging problem may be solved.

Figure 10:
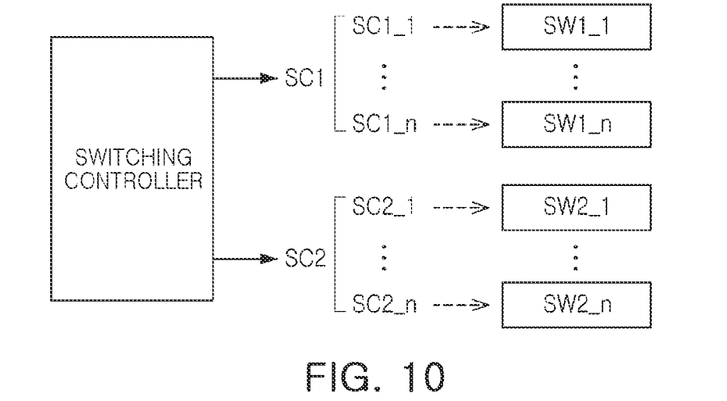
FIG. 10 is a view of a select control signal and a short control signal of a switching controller, according to an embodiment.

FIG. 10 is a view of a select control signal and a short control signal of the switching controller 50, according to an embodiment.

Referring to FIG. 10, as an example, the switching controller 50 may generate a select control signal SC1 including a first select signal SC1_1 to an n-th select signal SC1_n and output the first select signals SC1_1 to the n-th select signals SC1_n to the first select switches SW1_1 to the n-th select switches SW1_n of the select switch circuit 130, respectively.

Also, the switching controller 50 may generate a short control signal SC2 including a first short signal SC2_1 to an n-th short signal SC2_n and output the first short signal SC2_1 to the n-th short signals SC2_n to the first short switch SW2_1 to the n-th short switch SW2_n of the short switch circuit 150.

Figure 11A:
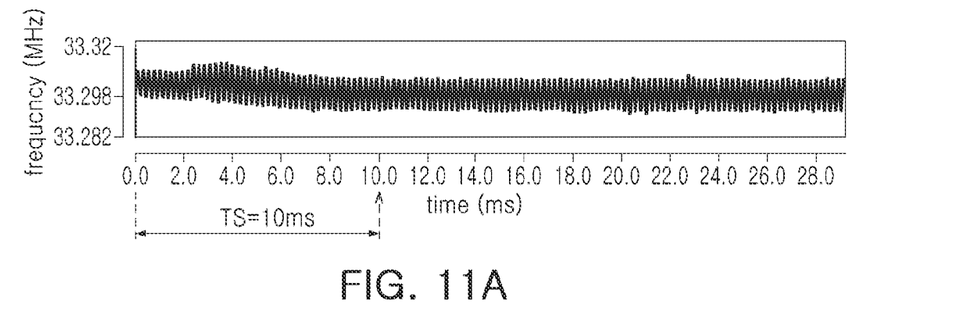
FIG. 11A is a view illustrating a settling time of an oscillator without a short switch, according to an embodiment.
Figure 11B:
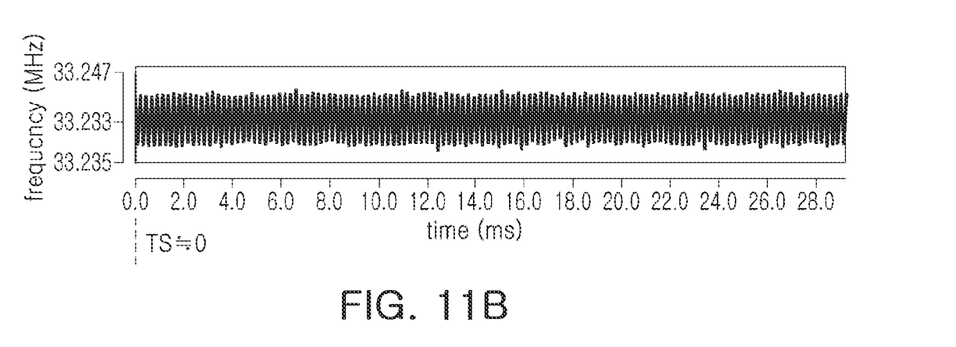
FIG. 11B is a view illustrating a settling time of the oscillator with the short switch.

FIG. 11A is a view illustrating a settling time of an oscillator without a short switch, and FIG. 11B is an explanatory view of a settling time of an oscillator including the short switch.

Referring to FIG. 11A, a settling time TS of the oscillator without the short switch is approximately 10.0 ms. Referring to FIG. 11B, the settling time TS of the oscillator including the short switch is approximately 0 ms.

Referring to FIGS. 11A and 11B, it can be seen that, compared to the settling time of the existing oscillator, the settling time of the oscillator according to the disclosure herein is significantly shortened.

The oscillator of the disclosure herein, including a capacitor circuit as described in the example embodiments above, may be applied to a touch sensing device. In such a case, an oscillator frequency for touch sensing may be stabilized at a high speed, so that a problem of a recognition error at an initial stage of an operation in the touch sensing device may be solved.

The switch controller 50, according to embodiments, may be implemented in a computing environment in which a processor (e.g., central processing unit (CPU), graphic processing unit (GPU), microprocessor, application specific integrated circuit (ASIC), field programmable gate arrays (FPGA), etc.), a memory (e.g. volatile memory (e.g., RAM, etc.), a non-volatile memory (e.g., ROM, flash memory, etc.), an input device (e.g., keyboard, mouse, pen, voice input device, touch input device, infrared camera, video input device, etc.), an output device (e.g., display, speaker, printer, etc.), and a communication connection device (e.g., modem, network interface card (NIC), integrated network interface, radio frequency transmitter/receiver, infrared port, USB connector, etc.) are interconnected (e.g., peripheral component interconnect (PCI), USB, firmware (IEEE 1394), optical bus structure, network, etc.).

As set forth above, embodiments disclosed herein may be applied to a touch sensing device configured to perform either one or both of capacitive sensing and inductive sensing, and fast settling of an oscillation frequency may be achieved at an initial stage of operation. Accordingly, a frequency shift at the initial stage of operation may be reduced, thereby improving touch sensing sensitivity.

The switching controller 50 in FIGS. 1 to 11B that performs the operations described in this application is implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1 to 11B that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMS, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A capacitor circuit, comprising:
a capacitor array including first to n-th capacitors connected to each other in parallel;
a select switch circuit including first to n-th select switches connected to the first to n-th capacitors in series, respectively;
a short switch circuit including first to n-th short switches connected to the first to n-th capacitors in parallel, respectively, and configured to operate complementarily to the first to n-th select switches, respectively; and
a switching controller configured to control the complementary operation of the short switch circuit and the select switch circuit to decrease a settling time of an oscillation frequency,
wherein n is an integer of 2 or greater.

2. The capacitor circuit of claim 1, wherein a k-th select switch, among the first to n-th select switches, is connected to a k-th capacitor, among the first to n-th capacitors, in series, and
wherein $1 \leq k \leq n$.

3. The capacitor circuit of claim 2, wherein a k-th short switch, among the first to n-th short switches, is connected to the k-th capacitor in parallel.

4. The capacitor circuit of claim 3, wherein, in response to a short control signal, the k-th short switch is turned off when the k-th select switch is turned on, and turned on when the k-th select switch is turned off.

5. The capacitor circuit of claim 4, wherein the k-th short switch connects two ends of the k-th capacitor to make potentials at the two ends of the k-th capacitor equal, when the k-th short switch is in an ON state.

6. The capacitor circuit of claim 1, wherein each of the first to n-th select switches includes an NMOS transistor.

7. The capacitor circuit of claim 1, wherein each of the first to n-th select switches includes a PMOS transistor.

8. The capacitor circuit of claim 1, wherein each of the first to n-th short switches includes a transmission gate.

9. An oscillator, comprising:
a capacitor circuit including:
first to n-th capacitors connected to each other in parallel;
a select switch circuit including first to n-th select switches connected to the first to n-th capacitors in series, respectively; and
a short switch circuit including first to n-th short switches connected to the first to n-th capacitors in parallel, respectively, and configured to operate complementarily to the first to n-th select switches, respectively;
an inductor circuit connected to the capacitor circuit for resonance; and
a switching controller configured to control selection of at least one of the first to n-th capacitors, and configured to control the complementary operation of the short switch circuit and the select switch circuit to decrease a settling time of an oscillation frequency,
wherein n is an integer of 2 or greater.

10. The oscillator of claim 9, wherein a k-th select switch, among the first to n-th select switches, is connected to a k-th capacitor, among the first to n-th capacitors, in series, and
wherein $1 \leq k \leq n$.

11. The oscillator of claim 10, wherein a k-th short switch, among the first to n-th short switches, is connected to the k-th capacitor in parallel.

12. The oscillator of claim 11, wherein, in response to a short control signal, the k-th short switch is turned off when the k-th select switch is turned on, and turned on when the k-th select switch is turned off.

13. The oscillator of claim 12, wherein the k-th short switch connects two ends of the k-th capacitor to make potentials at the two ends of the k-th capacitor equal, when the k-th short switch is in an ON state.

14. The oscillator of claim 9, wherein each of the first to n-th select switches includes an NMOS transistor.

15. The oscillator of claim 9, wherein each of the first to n-th select switches includes a PMOS transistor.

16. The oscillator of claim 9, wherein each of the first to n-th short switches includes a transmission gate.

17. A capacitor circuit, comprising:
a plurality of capacitors connected to each other in parallel;
a plurality of select switches connected to the plurality of capacitors in series, respectively;
a plurality of short switches connected to the plurality of capacitors in parallel, respectively; and
a switching controller configured to control a complementary operation of the short switches and the select switches to decrease a setting time of an oscillation frequency,
wherein a short switch, among the plurality of short switches, connected to a capacitor,
among the plurality of capacitors, in parallel connects two ends of the capacitor to make potentials at the two ends of the capacitor equal, when the short switch is in an ON state.

18. The capacitor circuit of claim 17, wherein the short switch is configured to be turned off when a select switch, among the plurality of select switches, connected to the capacitor in series is turned on, and wherein the short switch is configured to be turned on when the select switch is turned off.

19. The capacitor circuit of claim 17, wherein the plurality of short switches comprise a plurality of transmission gates.

20. The capacitor circuit of claim 17, wherein the plurality of select switches comprise a plurality of NMOS transistors, and the plurality of short switches comprise a plurality of PMOS transistors.

\* \* \* \* \*